(12) United States Patent
Vinson et al.

(10) Patent No.: US 7,642,131 B2
(45) Date of Patent: Jan. 5, 2010

(54) DECOUPLING CAPACITOR CLOSELY COUPLED WITH INTEGRATED CIRCUIT

(75) Inventors: Robert S. Vinson, Indialantic, FL (US); Joseph B. Brief, West Melbourne, FL (US); Donald J. Beck, Palm Bay, FL (US); Gregory M. Jandzio, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 15 days.

(21) Appl. No.: 11/557,564

(22) Filed: Nov. 8, 2006

(65) Prior Publication Data
US 2007/0065983 A1 Mar. 22, 2007

Related U.S. Application Data

(62) Division of application No. 10/696,918, filed on Oct. 30, 2003, now Pat. No. 7,145,233, which is a division of application No. 09/915,762, filed on Jul. 26, 2001, now Pat. No. 6,700,794.

(51) Int. Cl.
*H01L 21/00* (2006.01)
(52) U.S. Cl. .......................... 438/109; 438/FOR. 368; 438/381; 438/110; 257/686; 257/777; 257/724; 257/783; 361/763; 361/764; 361/782; 361/734; 361/738; 361/811
(58) Field of Classification Search .................. 257/777, 257/778, 723–724, 782, 780, 784, 686; 361/760–764, 361/782–784, 734, 738, 811, 790; 438/107, 438/108, 109, 110, 381, FOR. 368
See application file for complete search history.

(56) References Cited

U.S. PATENT DOCUMENTS

| 5,132,613 | A | | 7/1992 | Papae et al. | 324/158 |
| 5,140,496 | A | | 8/1992 | Heinks et al. | 361/306.2 |
| 5,184,399 | A | | 2/1993 | Ueno et al. | 29/846 |
| 5,311,057 | A | | 5/1994 | McShane | 257/676 |
| 5,377,072 | A | | 12/1994 | Sparkman et al. | 361/306.2 |
| 5,528,083 | A | | 6/1996 | Malladi et al. | 257/786 |
| 5,751,139 | A | | 5/1998 | Jordan et al. | 323/222 |
| 5,767,564 | A | * | 6/1998 | Kunimatsu et al. | 257/532 |
| 6,005,778 | A | | 12/1999 | Spielberger et al. | 361/770 |
| 6,049,465 | A | | 4/2000 | Blish, II et al. | 361/767 |
| 6,097,973 | A | | 8/2000 | Rabe et al. | 455/572 |
| 6,137,275 | A | | 10/2000 | Ravon | 323/274 |
| 6,147,478 | A | | 11/2000 | Skelton et al. | 232/288 |
| 6,181,002 | B1 | | 1/2001 | Juso et al. | 257/686 |
| 6,191,477 | B1 | | 2/2001 | Hashemi | 257/706 |

(Continued)

*Primary Examiner*—Thao X Le
*Assistant Examiner*—Thanh Y Tran
(74) *Attorney, Agent, or Firm*—Allen, Dyer, Doppelt, Milbrath & Gilchrist, P.A.

(57) ABSTRACT

An integrated circuit module, decoupling capacitor assembly and method are disclosed. The integrated circuit module includes a substrate and integrated circuit die mounted on the substrate and having die pads and an exposed surface opposite from the substrate. A plurality of substrate bonding pads are positioned on the substrate adjacent the integrated circuit die. A decoupling capacitor assembly is mounted on each integrated circuit die and includes a capacitor carrier secured onto the exposed surface of the integrated circuit die and a decoupling capacitor carried by the capacitor carrier. A wire bond extends from the decoupling capacitor assembly to a die pad and from a die pad to a substrate bonding pad.

3 Claims, 6 Drawing Sheets

U.S. PATENT DOCUMENTS

| | | | |
|---|---|---|---|
| 6,222,260 B1 | 4/2001 | Liang et al. | 257/691 |
| 6,284,985 B1 | 9/2001 | Naba et al. | 174/260 |
| 6,407,456 B1 | 6/2002 | Ball | 257/777 |
| 6,429,536 B1 | 8/2002 | Liu et al. | 257/786 |
| 6,441,483 B1 | 8/2002 | Akram | 257/724 |
| 6,650,009 B2 | 11/2003 | Her et al. | 257/686 |
| 6,873,035 B2 | 3/2005 | Watanabe et al. | 257/686 |

* cited by examiner

DECOUPLING CAPACITOR CLOSELY COUPLED WITH INTEGRATED CIRCUIT

RELATED APPLICATION

This application is a divisional application of Ser. No. 10/696,913 filed on Oct. 30, 2003, now U.S. Pat. No. 7,145,233 which is a divisional of Ser. No. 09/915,762 filed Jul. 26, 2001, now U.S. Pat. No. 6,700,794, the disclosures of which are hereby incorporated by reference in their entirety.

FIELD OF THE INVENTION

This invention relates to integrated circuits, and more particularly, to decoupling capacitors that are coupled in close proximity to a semiconductor or integrated circuit die.

BACKGROUND OF THE INVENTION

High-speed digital integrated circuit microprocessors and memories formed as semiconductor die (or integrated circuit chips) require multiple decoupling capacitors to aid in eliminating high-speed transient noise, and other circuit induced problems. For example, where high-speed transient noise is above a resonance point, inductive resistance forms a major impedance. As a result, decoupling capacitors are physically placed as close as possible to the semiconductor die, i.e., integrated circuit, and in particular, to any of its logic pins.

Many of these decoupling capacitors are discrete ceramic subassemblies having electrodes, a ceramic layer and terminated edge. They use wire connects and long path lengths from the decoupling capacitor positioned outside the periphery of the semiconductor die. This long length increases the equivalent series resistance (ESR) and equivalent series inductance (ESL). The equivalent series resistance is increased because the resistance of the capacitor leads in series with the equivalent resistance of the capacitor plates increases and causes the capacitor to dissipate power and produce loss when various currents are flowing. This is detrimental at various radio frequencies. The equivalent series inductance models any inductance of capacitor leads in series with the equivalent inductance of capacitor plates.

FIG. 1 shows a prior art multi-chip module (MCM) 10 or other semiconductor structure, e.g., integrated circuit chip module, where three semiconductor die (or chips) 14 with adjacent substrate bonding pads 20 are positioned on a substrate 12, such as a multilayer ceramic substrate formed from green tape sheets. A typical logic pin 18 placement is illustrated for the three semiconductor die. Decoupling capacitors 16 are positioned outside the peripheral boundary defined by the semiconductor die, as illustrated. Other thick film capacitors or other semiconductor devices 24 are printed or surface mounted in close proximity to the semiconductor die. The dimensional footprint imposed by the decoupling capacitors and the other semiconductor devices on the substrate adds severe dimensional restrictions, limiting additional structures. Also, because of the dimension restrictions, smaller decoupling capacitors, capacitors, and other semiconductor devices must be used, which could decrease reliability and reduce overall capacitance. FIG. 1 illustrates the typical wire bond or substrate trace 22 routing length from a substrate bond pad to the nearest decoupling capacitor. This long length is indicative of how the longer interconnect length could increase the equivalent series inductance and equivalent series resistance, degrading performance of the overall chip operation.

One prior art capacitor mounting technique is described in U.S. Pat. No. 5,377,072. A single, large metal plate bypass capacitor is stacked onto and substantially covers a silicon substrate that is separated by a thermally-grown silicon dioxide dielectric layer. Self-inductance of the bypass capacitor is minimized because the capacitor dielectric is formed as a very thin layer by the thermal oxidation of silicon. Bonding wires can be used to interconnect the plates of the bypass capacitor with the power and ground terminals in a semiconductor device, and enable minimal length bonding wires. Although there is some stacking and reduction of wire length, the structure is limited to a single metal-plate bypass capacitor that is large in dimension relative to the semiconductor device. This would not be adequate where a plurality of decoupling capacitors are required relative to a semiconductor die, such as an integrated circuit, where a minimal footprint is desired.

SUMMARY OF THE INVENTION

It is therefore an object of the present invention to provide an improved integrated circuit chip module, such as a multi-chip module, having improved decoupling capacitor characteristics with decreased equivalent series inductance and equivalent series resistance.

In accordance with the present invention, an integrated circuit module includes a substrate and integrated circuit die mounted on the substrate. The integrated circuit die includes logic pins in an exposed surface opposite from the substrate. A plurality of substrate bonding pads are positioned on the substrate adjacent to the integrated circuit die. A decoupling capacitor assembly is mounted on each integrated circuit die and includes a capacitor carrier secured onto the exposed surface of the integrated circuit die. A decoupling capacitor is carried by the capacitor carrier. A wire bond extends from the decoupling capacitor assembly to a logic pin and from a logic pin to a substrate bonding pad.

A plurality of decoupling capacitor assemblies are mounted on the integrated circuit die. The plurality of decoupling capacitors are mounted in series along the integrated circuit die such that the decoupling capacitors can have short wire bonding length to a respective logic pin.

In one aspect of the present invention, the capacitor carrier is formed from an aluminum nitride substrate that ranges in thickness from about 5 mil to about 50 mil, and preferably about 10 mil. A wire bond extends from the decoupling capacitor to a logic pin of the integrated circuit die, in one aspect, and in yet another aspect, a wire bond can extend from the capacitor carrier to a logic pin of the integrated circuit die when a thin film metallization layer is secured onto the capacitor carrier and a conductive adhesive allows signal transfer from the capacitor through the thin film metallization layer to a die pad on the capacitor carrier. Thus, wire bonding can extend from the capacitor carrier and its die pad to the die pad or logic pin on the integrated circuit chip.

A multi-chip module includes a plurality of the integrated circuit die mounted on the substrate, which could be a ceramic substrate with a plurality of decoupling capacitor assemblies positioned on each integrated circuit die.

A decoupling capacitor assembly is also disclosed and used for decoupling integrated circuit die. A method aspect of the present invention is also disclosed.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

Figure 1:
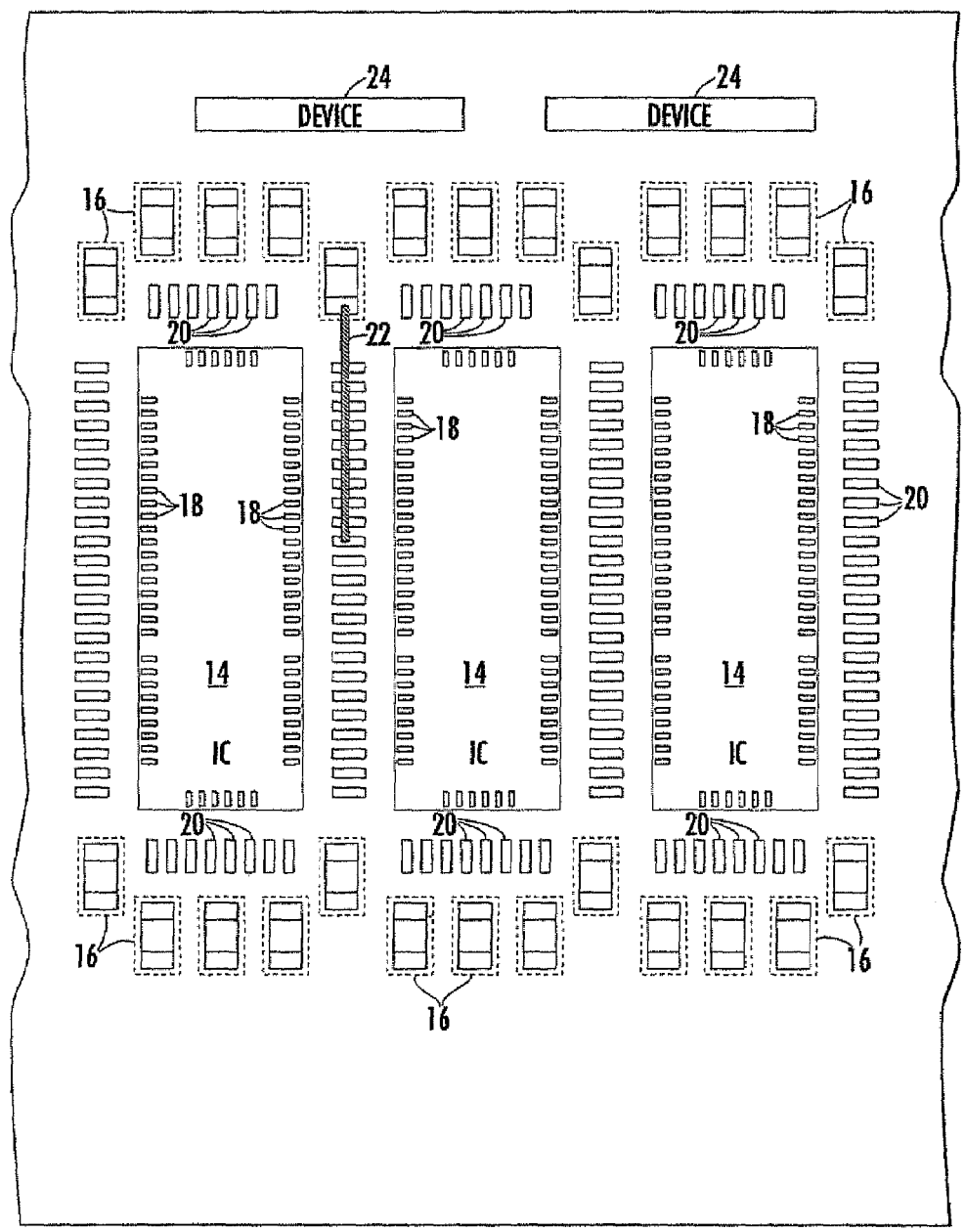
FIG. 1 is a plan view of a substrate having three semiconductor die and showing the prior art technique of placing decoupling capacitors spaced from the periphery of the semiconductor die.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous and allows increased performance of high-speed digital microprocessors and memories such as Dynamic Random Access Memories (RAM) and other semiconductor die and integrated circuits where decoupling capacitors are necessary for operation, as in common multi-chip modules. As compared to any prior art semiconductor die and decoupling capacitor layouts, the present invention provides a smaller footprint where decoupling capacitors are not remotely located from the semiconductor die, as in the prior art FIG. 1. Instead, in accordance with the present invention, decoupling capacitor subassemblies are placed physically close to the semiconductor die, e.g., integrated circuit chip or die, and to its logic pins, to decrease the routing complexity and achieve lower inductance. The present invention decreases the Equivalent Series Resistance and Equivalent Series Inductance. Throughout the description, the term semiconductor die is interchangeable with the term integrated circuit or integrated circuit chip. The term integrated circuit chip module could include one integrated circuit chip or several, as in a multi-chip module (MCM).

The decoupling capacitors are attached to the exposed surface of a semiconductor die using a capacitor carrier of the present invention, which is formed as a decoupling capacitor assembly. The present invention delivers the shortest signal length possible between the semiconductor die and the decoupling capacitor. The decoupling capacitor is typically formed as a multilayer ceramic capacitor, and when coupled with the capacitor carrier, a decoupling capacitor assembly is formed and provides additional system miniaturization. As a result, other thick film capacitors and semiconductor devices can be printed or surface mounted in closer proximity to the semiconductor die. Any previously severe dimensional restrictions that limited the addition of other semiconductor devices and circuit structures can now be placed more proximate to the semiconductor die.

Greater capacitance values and reliability can be achieved, and smaller microprocessor, integrated circuit, memory and semiconductor die sizes are now available. The capacitor subassemblies are mounted directly on the integrated circuit (IC) or other semiconductor die. Wire connects are made either directly from die pads formed as logic pins to the capacitor carrier, or onto capacitor terminations allowing shorter length paths to increase the available "real estate" on the substrate or circuit board. Conventional assembly processes and materials can be used, in accordance with the present invention.

FIG. 1 illustrates a multi-chip module or similar integrated circuit support device, and shows the prior art technique of placing decoupling capacitors spaced from a semiconductor die, such as the illustrated integrated circuit chip. The invention is not limited to multi-chip modules, but the multi-chip module is only used for purposes of illustration. The multi-chip module 10 includes a substrate 12, such as a circuit board or similar substrate. A ceramic substrate is illustrated and formed from green tape layers. Three semiconductor die 14 are mounted on the substrate 12. Each semiconductor die, as a non-limiting example, is an integrated circuit chip that is about 100 mils by about 300 mils. The integrated circuit chip could also be a memory or other semiconductor device. The decoupling capacitors 16, as a non-limiting dimensional example, are smaller and could range from about 20 by about 40 mils. The decoupling capacitors 16, can be formed as high value, microfarad, multilayer ceramic capacitors, as known to those skilled in the art. The semiconductor die 14 includes die pads for connecting wire bonds or other interconnects, which in the described embodiment are typical logic pins 18 positioned as illustrated. Substrate bonding pads 20 are positioned on the substrate and used for bonding wire, such as gold wire bonding, as known to those skilled in the art. The FIG. 1 prior art shows a wire bond or substrate trace 22 that extends past the periphery of the semiconductor die from the substrate bonding pad 20 to a decoupling capacitor 16. Other capacitors or other semiconductor devices 24 are shown farther from the semiconductor die and could be surface mounted or printed, in some instances. This long length of interconnect increases the equivalent series inductance and equivalent series resistance.

By way of background, and using a semiconductor memory device, such as a Random Access Memory device as an example, a short description is given as to the necessity of and technical problems associated with decoupling capacitors. Dynamic RAMs have large transience generated during refresh cycles that require the decoupling capacitors to avoid "V bumps" or other error problems. These variations can be produced by DC drift, bulk variations and switching transience. Any DC drift naturally is dependent upon power-supply design and usually not on any board level decoupling. The bulk variations are usually produced by current demands of internal storage cells during the refresh cycle while transient "noise" is produced by switching currents that are internal to the integrated circuit chip. Thus, these three voltage variations can add and must be maintained within an allowed tolerance.

Decoupling capacitors are used to achieve a greater effective capacitance adjacent the IC chip and reduce inductance and resistance voltage drops. Thus, the decoupling capacitors are used to reduce line noise. Multilayer ceramic capacitors have been found advantageous. The problem, as is well known to those skilled in the art, is such that when the decoupling capacitor is mounted on a circuit board or other substrate, the lead lengths and board lines from a circuit device to the capacitor and to ground create major sources of inductance, which must be minimized to obtain adequate decoupling performance under high-speed transient conditions. Not only is a high quality decoupling capacitor necessary, but also minimum lead lengths, wiring, and gridding of power supplies is necessary. Although multiple decoupling capacitors are shown in the example of FIG. 1, the line lengths are still long and have increased inductance without increasing effective decoupling capacity.

Figure 4:
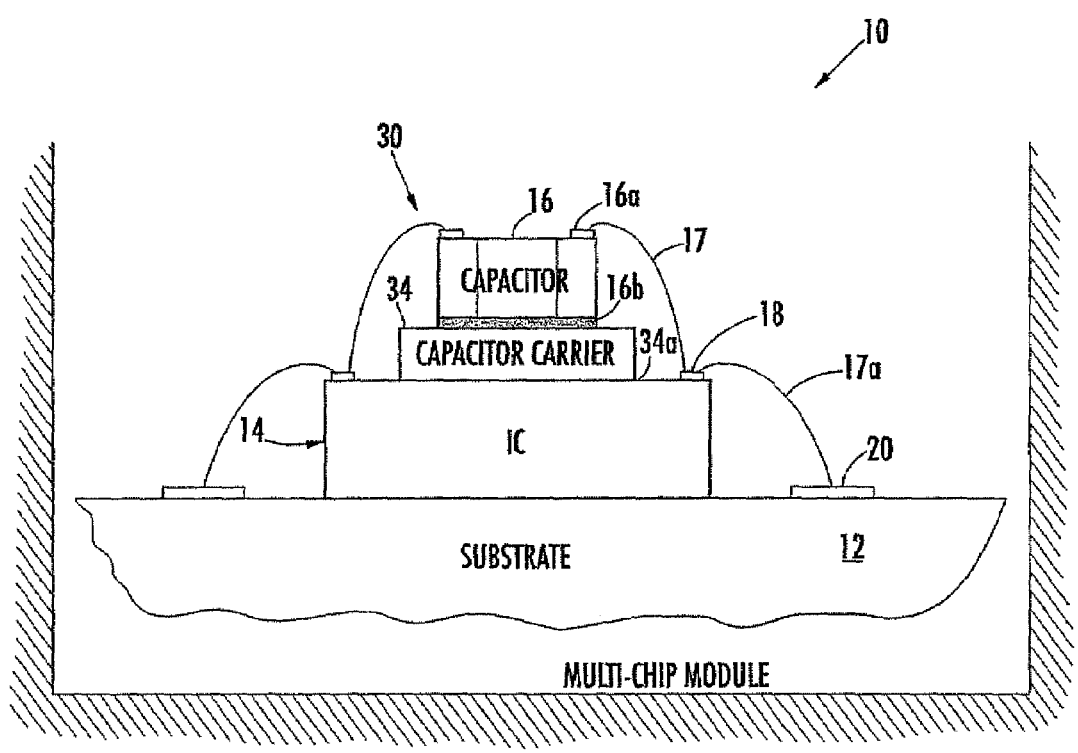
FIG. 4 is a fragmentary, sectional view of a semiconductor die as an integrated circuit chip having a capacitor carrier and decoupling capacitor mounted directly to the integrated circuit and wire bonding that extends from the capacitor to the integrated circuit.

FIG. 4 illustrates a fragmentary, partial sectional view of a decoupling capacitor subassembly 30 that is mounted directly onto an integrated circuit 31 or similar semiconductor die 14 that is shown as a bare die positioned on a multilayer ceramic substrate 12 formed from green tape layers (shown by dashed lines) or other techniques as known to those skilled in the art. Substrate bonding pads 20 are positioned on the substrate as known to those skilled in the art. The integrated circuit or other semiconductor die 14, as illustrated, is formed from silicon, as known to those skilled in the art. As shown, the decoupling capacitor subassembly is formed such that the decoupling capacitor 16 is mounted on a capacitor carrier 34 that is formed as an aluminum nitride substrate layer that is preferably about 10 mil thick, as a non-limiting example, and can range from as little as 5 mil to about 50 mil thickness, as an example. The ceramic decoupling capacitor, capacitor carrier and integrated circuit chip are all substantially matched as to their coefficient of thermal expansion (CTE). The ceramic substrate is also preferably CTE matched.

The decoupling capacitor 16 is first mounted on the capacitor carrier 34 and is adhesively bonded, such as by a conductive or non-conductive epoxy. The decoupling capacitor is formed from a multilayer ceramic capacitor in one aspect, and includes a ceramic layer, terminated edge, electrodes and capacitor terminals 16a for connecting wire bonds, such as gold connecting wire, as known to those skilled in the art. The decoupling capacitor is placed on the capacitor carrier 34, is bonded down, such as by an adhesive 16b, including epoxy or other adhesives, and then cured. The curing could include heating within a cure oven, as known to those skilled in the art.

The semiconductor die is attached to the substrate 12 or within multi-chip module 10 having the substrate. The carrier 34 with the attached decoupling capacitor 16 is then placed via pick and place machines physically onto the semiconductor die 14 and cured in place with an adhesive 34a, such as an epoxy adhesive or other similar adhesives, which could also be conductive or non-conductive adhesives.

Figure 2:
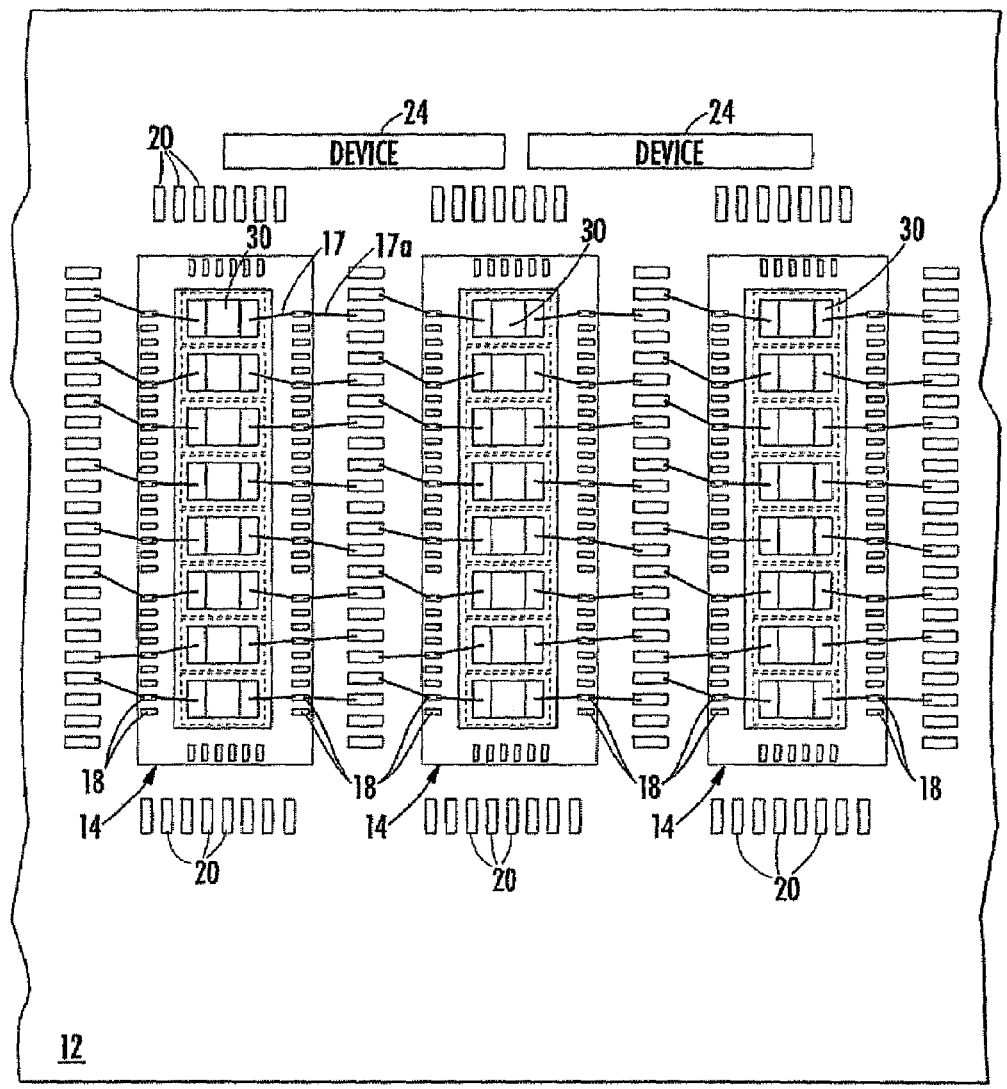
FIG. 2 is a plan view similar to FIG. 1, having three semiconductor die on a substrate, but showing decoupling capacitor subassemblies mounted to the top of the semiconductor die in accordance with the present invention.

As shown in FIG. 2, eight decoupling capacitor subassemblies 30 are formed with the capacitor carrier 34 and the decoupling capacitor 16 and physically placed onto the center portions of the semiconductor die, typically using pick and place machinery, secured with an adhesive, and cured in place. At the next processing step, wire bonds 17 formed with gold (or other similar conducting wire bonds) are formed across the capacitor terminals 16a to the logic pins 18 on the semiconductor die. Wire bonds 17a extend from the logic pins on the semiconductor die to substrate bonding pads 20 as shown in FIG. 4 and FIG. 2. This forms closely coupled capacitors for a closely coupled circuit.

Figure 3:
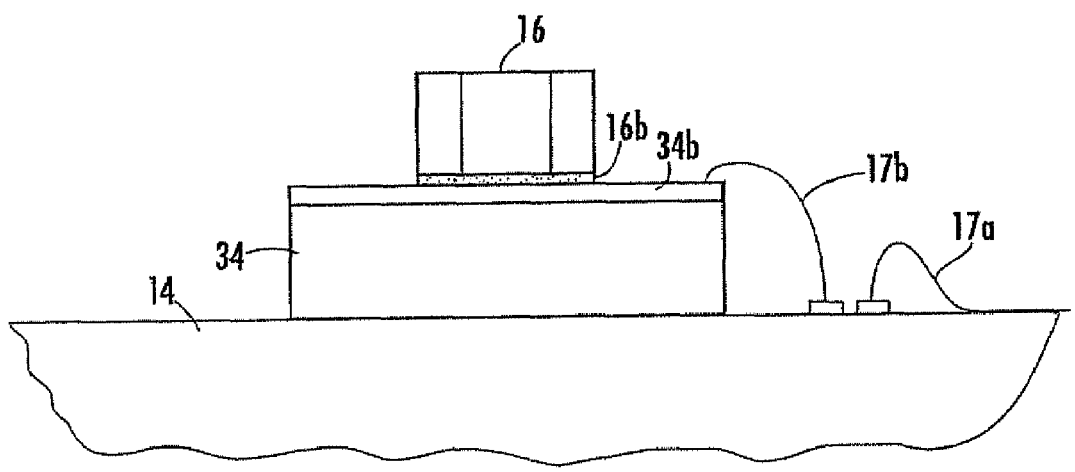
FIG. 3 is a fragmentary, sectional view of a drawing that shows a capacitor subassembly mounted directly on a semiconductor die formed as an integrated circuit and showing a thin film metallization layer.
Figure 4A:
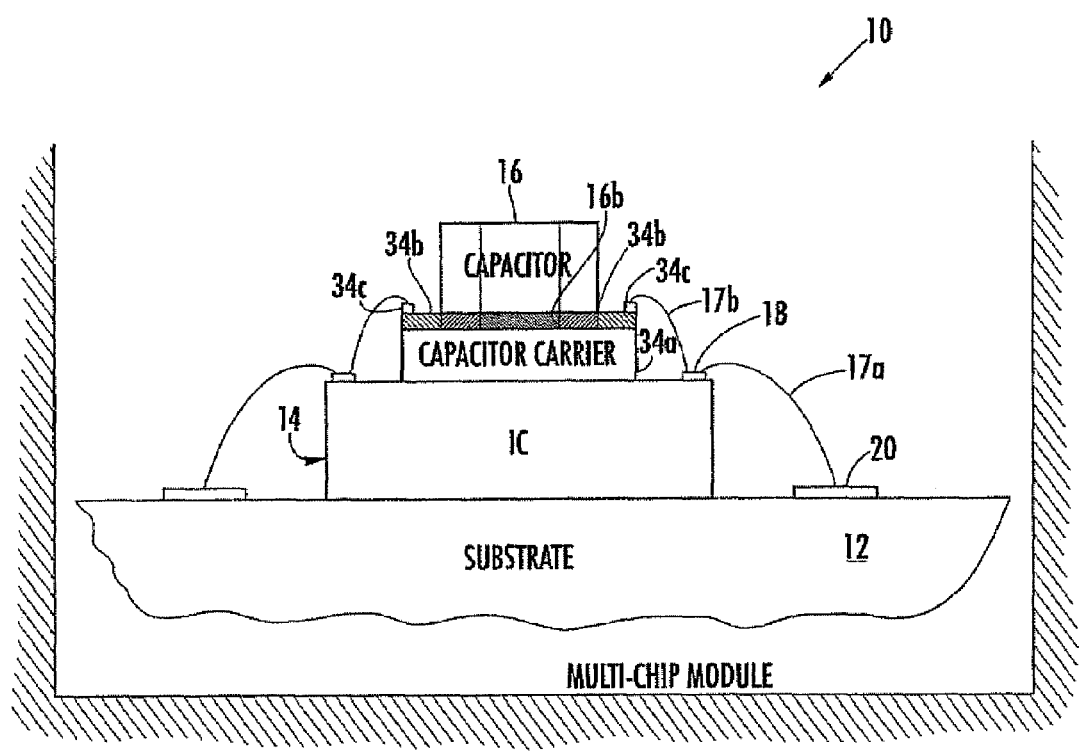
FIG. 4A is a fragmentary, sectional view of a semiconductor die as integrated circuit chip similar to FIG. 4, but showing a thin film metallization layer and conductive adhesive between the capacitor and capacitor carrier and wire bonding that extends from the capacitor carrier to the integrated circuit chip.

FIGS. 3 and 4A illustrate another multi-chip module having the ceramic substrate and integrated circuit chip as shown in FIG. 4A, including the capacitor subassembly 30, capacitor carrier 34, decoupling capacitor 16, logic pins 18 and substrate bonding pads 20. More importantly, the capacitor carrier includes a conductive thin film metallization layer 34b and the adhesive that secures the capacitor to the capacitor carrier is a conductive adhesive, such as a conductive epoxy, allowing a wire bond 17b from bonding pads 34c that engage the thin film metallization carrier to the logic pins 18 on the integrated circuit (although bonding pads 34c are not necessary). The capacitor electrodes are operative with the capacitor carrier and gold metallization layer 34b to provide the appropriate signal path. The decoupling capacitor is formed for this function. It is also possible that the capacitor and capacitor carrier are operative such that another conductive adhesive exists between the capacitor carrier and the integrated circuit and a metallization pattern extends along the bottom portion of the capacitor carrier to reduce the number of wire bonds such that the metallization pattern is operative with any circuit traces of the integrated circuit and no wire bond is necessary as existing between the capacitor carrier and the logic pin 18 of the integrated circuit.

Figure 5:
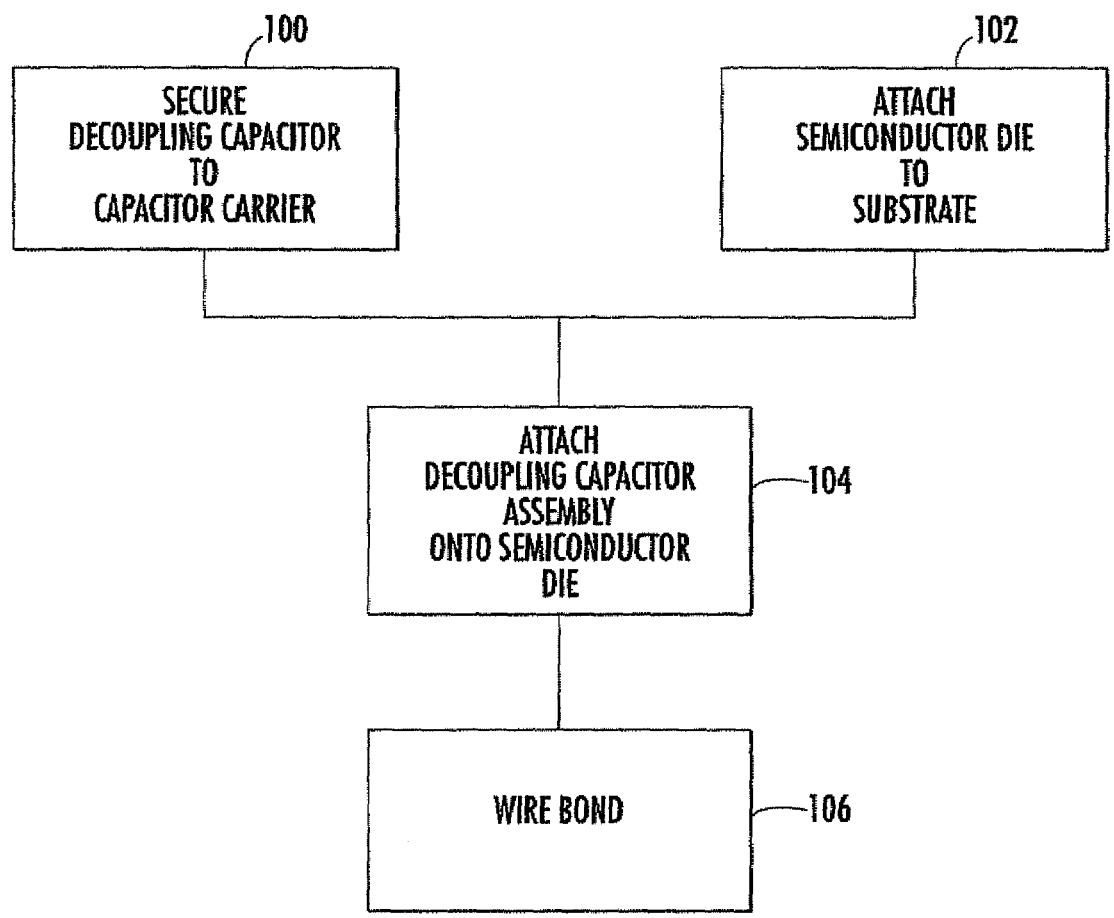
FIG. 5 is a flow chart illustrating a method of forming a multi-chip module using decoupling capacitor subassemblies of the present invention mounted on the semiconductor die.

FIG. 5 illustrates a basic, high level flow chart for the manufacturing process of the improved module shown in FIG. 2 and FIG. 4. At the start, the decoupling capacitor is mounted and secured by an adhesive, such as a non-conductive or conductive epoxy adhesive, to the capacitor carrier formed from the aluminum nitride substrate layer (block 100). It is then preferably cured to form the decoupling capacitor assembly. In a parallel process, the semiconductor die is attached to the substrate within the multi-chip module (block 102). The capacitor carrier with the attached decoupling capacitor as an assembly is placed via pick and place machines physically onto the semiconductor die (block 104) and cured in place. Wire bonding with gold or other wire bonds occurs across the capacitor to the logic pins on the semiconductor die and from the logic pins on the semiconductor die to the substrate bonding pads (block 106).

Although the above description is preceded with a description for decoupling capacitors, it is also possible that other resistors, inductors, semiconductor devices, including other integrated circuits, could be used with a carrier such as the described capacitor carrier, and thus, be broader than a capacitor carrier and mount devices to the semiconductor die.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A method of forming an integrated circuit chip module comprising the steps of:

mounting a plurality of integrated circuit die directly on a substrate having die pads and an exposed surface opposite from the substrate, and a plurality of substrate bonding pads positioned directly on the substrate adjacent each integrated circuit die, wherein the plurality of integrated circuit die directly contact the substrate;

adhesively securing a plurality of decoupling capacitors onto a plurality of capacitor carriers to form a plurality of decoupling capacitor assemblies, wherein each capacitor carrier is formed as an aluminum nitride substrate that is about 5 mil to about 50 mil thickness, a thin film metallization layer formed directly on each capacitor carrier and a conductive adhesive layer applied directly onto the thin film metallization layer for conducting current between the capacitor and capacitor carrier and securing each decoupling capacitor onto the thin film metallization layer;

adhesively securing the plurality of decoupling capacitor assemblies in series onto each integrated circuit die; and wire bonding from the thin film metallization layer to a logic pin on the integrated circuit die and wire bonding from the logic pin to substrate bonding pads positioned on the substrate.

2. A method according to claim 1, and further comprising the step of forming the substrate as a ceramic substrate.

3. A method according to claim 1, and further comprising the step of forming the substrate as a polymeric substrate.

* * * * *